(12) United States Patent
Yudahira

(10) Patent No.: US 6,462,550 B2
(45) Date of Patent: Oct. 8, 2002

(54) BATTERY VOLTAGE DETECTION APPARATUS AND DETECTION METHOD

(75) Inventor: Hirofumi Yudahira, Shizuoka (JP)

(73) Assignees: Matsushita Electric Industrial Co, Ltd., Osaka (JP); Toyota Jidosha Kabushiki Kaisha, Aichi (JP)

(*) Notice: Subject to any disclaimer, the term of this patent is extended or adjusted under 35 U.S.C. 154(b) by 0 days.

(21) Appl. No.: 09/765,482

(22) Filed: Jan. 18, 2001

(65) Prior Publication Data

US 2001/0019269 A1 Sep. 6, 2001

(30) Foreign Application Priority Data

Jan. 18, 2000 (JP) ........................................ 2000-009554

(51) Int. Cl.⁷ ............................................. G01N 27/416
(52) U.S. Cl. ....................................................... 324/426
(58) Field of Search ............................ 324/426, 1, 430; 320/126; 340/636

(56) References Cited

U.S. PATENT DOCUMENTS

| | | | |
|---|---|---|---|
| 4,590,430 A | | 5/1986 | Vandenberghe et al. .... 324/427 |
| 5,281,920 A | * | 1/1994 | Wurst ........................ 324/430 |
| 5,808,469 A | * | 9/1998 | Kopera ...................... 324/434 |

FOREIGN PATENT DOCUMENTS

| | | |
|---|---|---|
| DE | 19618897 | 11/1997 |
| EP | 0432640 | 6/1991 |
| JP | 2000-014027 | 1/2000 |

* cited by examiner

Primary Examiner—Edward H. Tso
Assistant Examiner—Pia Tibbits
(74) Attorney, Agent, or Firm—Michael K. Kelly; Snell & Wilmer, LLP

(57) ABSTRACT

A voltage detection apparatus for detecting a voltage of at least one battery includes: capacitor means to which a voltage is applied from the at least one battery and in which an electric charge accumulates; adjustment means for adjusting potentials at both ends of the capacitor means such that a potential difference between a potential at one end of the capacitor means and a reference potential is less than a potential difference between a potential at one end of the at least one battery and the reference potential, and that a potential difference between a potential at another end of the capacitor means and the reference potential is less than a potential difference between a potential at another end of the at least one battery and the reference potential; and voltage detection means for detecting a voltage of the at least one battery based on a potential difference between the one end of the capacitor means and the other end of the capacitor means after the potentials of both ends of the capacitor means have been adjusted by the adjustment means.

13 Claims, 3 Drawing Sheets

BATTERY VOLTAGE DETECTION APPARATUS AND DETECTION METHOD

BACKGROUND OF THE INVENTION

1. Field of the Invention

The present invention relates to an apparatus and a method for detecting a voltage of batteries used as a power source for an electric motor of a hybrid vehicle which incorporates the electric motor and a combustion engine together as a driving source thereof.

2. Description of the Related Art

An electric motor used as a driving source of an electric car is driven by a battery power supply in which there are a plurality of battery units in a series connection and each of the plurality of the battery units is composed of several low-voltage batteries in a series connection. In such a battery power supply, all of the batteries in the battery units are required to operate normally and at an equal voltage. Therefore, it is necessary to detect a voltage of each battery unit in which several batteries are combined to confirm that each battery is operating normally. The voltage of the battery unit is usually detected by means of a differential amplifier.

However, in the above-described battery power supply, the total voltage may be as high as about 400 V, so that the battery power supply is required to be in a floating state in which the circuitry is not electrically grounded. Therefore, the voltage of each battery unit is measured in the floating state, i.e., without being established against a ground potential, so that there is a possibility that the detected voltages may undergo substantial fluctuation. Particularly, the voltage of a battery power supply used as a driving source of a hybrid vehicle is normally supplied to an electric motor via an inverter so that the voltage of each battery unit may undergo an even greater fluctuation. A battery unit voltage which in itself undergoes a great fluctuation can not be accurately detected.

SUMMARY OF THE INVENTION

In one aspect of the invention, there is provided a voltage detection apparatus for detecting a voltage of at least one battery, including: capacitor means to which a voltage is applied from the at least one battery and in which an electric charge accumulates; adjustment means for adjusting potentials at both ends of the capacitor means such that a potential difference between a potential at one end of the capacitor means and a reference potential is less than a potential difference between a potential at one end of the at least one battery and the reference potential, and that a potential difference between a potential at another end of the capacitor means and the reference potential is less than a potential difference between a potential at another end of the at least one battery and the reference potential; and voltage detection means for detecting a voltage of the at least one battery based on a potential difference between the one end of the capacitor means and the other end of the capacitor means after the potentials of both ends of the capacitor means have been adjusted by the adjustment means.

In one embodiment of the invention, the capacitor means includes a plurality of capacitors in a series connection.

In another embodiment of the invention, the capacitor means is electrically connected with the at least one battery via a first switching means, the adjustment means includes a second switching means for switching a state of the capacitor means so as to be electrically coupled or decoupled to or from a prescribed potential, and the voltage detection means is electrically coupled to the capacitor means via a third switching means.

In still another embodiment of the invention, the capacitor means is electrically coupled to the prescribed potential via the second switching means, and the potentials at both ends of the capacitor means are adjusted.

In still another embodiment of the invention, a potential difference between the one end of the at least one battery and the other end of the at least one battery is equal to the potential difference between the one end of the capacitor means and the other end of the capacitor means.

In still another embodiment of the invention, the capacitor means includes a plurality of capacitors in a series connection and at least one node between the plurality of capacitors is coupled to the prescribed potential via the second switching means.

In still another embodiment of the invention, the voltage detection apparatus further includes a fourth switching means for switching a state of a first input terminal of the voltage detection means so as to be electrically coupled or decoupled to or from the reference potential.

In still another embodiment of the invention, the first input terminal is electrically coupled to the reference potential via the fourth switching means and a potential of the first input terminal is equal to the reference potential.

In still another embodiment of the invention, the voltage detection apparatus further includes conversion means for converting an analog signal from the voltage detection means to a digital signal.

In still another embodiment of the invention, the voltage detection means is a differential amplifier.

In another aspect of the invention, there is provided a method for detecting a voltage of at least one battery by means of the voltage detection apparatus, including the steps of: electrically coupling the at least one battery to the capacitor means via the first switching means so as to allow an electric charge to accumulate in the capacitor means; electrically isolating the at least one battery and the capacitor means from each other after the electric charge is accumulated in the capacitor means; electrically coupling the capacitor means to the reference potential via the second switching means, thereby adjusting the potentials at both ends of the capacitor means; electrically coupling the capacitor means to the voltage detection means via the third switching means; and detecting the potential difference between the one end of the capacitor means and the other end of the capacitor means by means of the voltage detection means.

In one embodiment of the invention, the voltage detection apparatus includes a fourth switching means for switching a state of a first input terminal of the voltage detection means so as to be electrically coupled or decoupled to or from the reference potential, the method further includes the steps of: electrically coupling the first input terminal to the reference potential via the fourth switching means; and switching a state of the first input terminal so as not to be electrically coupled to the reference potential via the fourth switching means after the step of electrically coupling the capacitor means to the voltage detection means.

In another embodiment of the invention, the step of adjusting the potentials at both ends of the capacitor means and the step of electrically coupling the first input terminal to the reference potential are performed simultaneously.

Thus, the invention described herein makes possible the advantages of providing a battery voltage detection apparatus which is capable of accurately measuring a voltage of a battery, and a method of detecting a voltage of a battery by means of the apparatus.

These and other advantages of the present invention will become apparent to those skilled in the art upon reading and understanding the following detailed description with reference to the accompanying figures.

DESCRIPTION OF THE PREFERRED EMBODIMENTS

Embodiments of the present invention will now be described with reference to the accompanying drawings.

Figure 1:
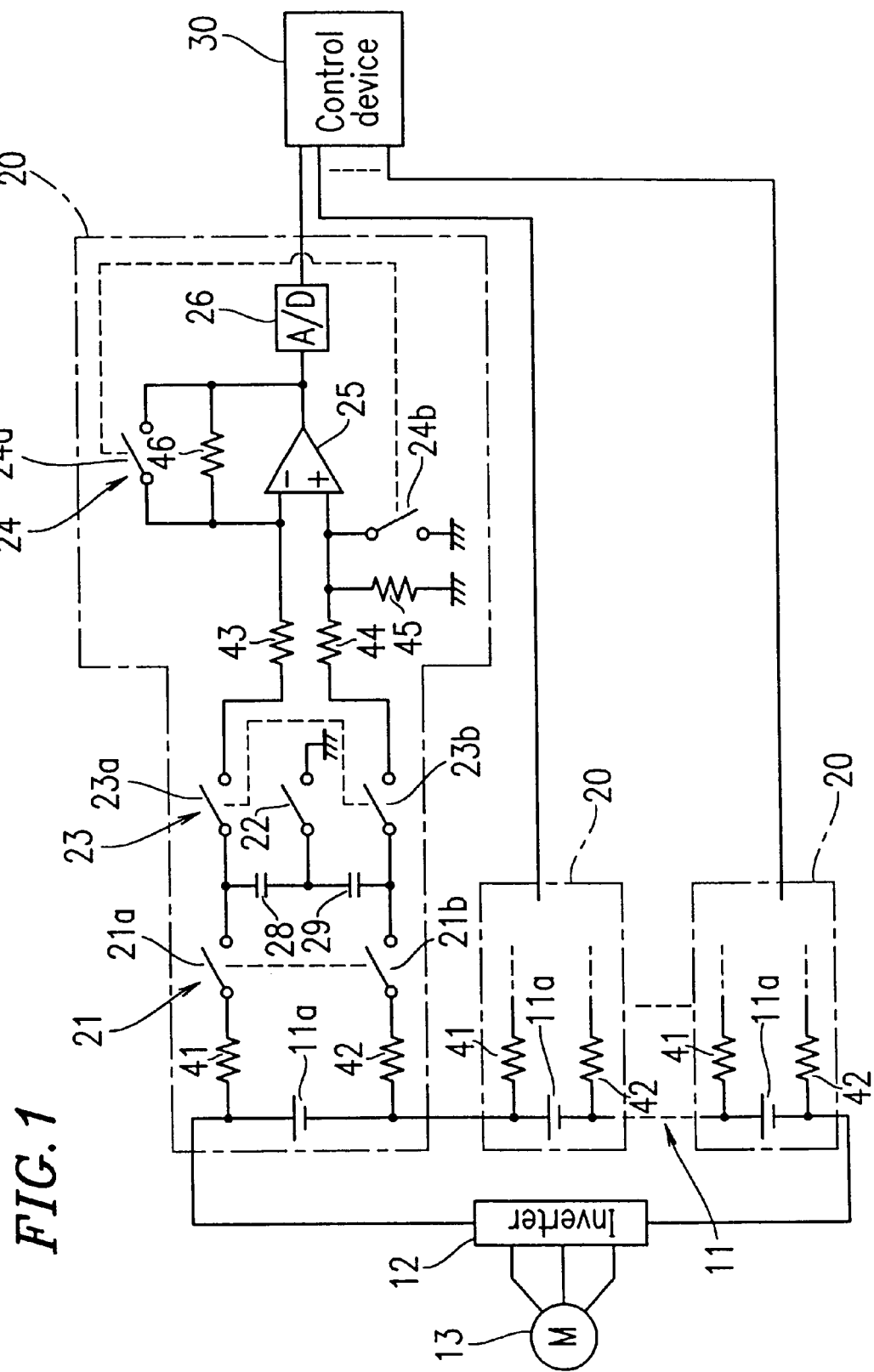
FIG. 1 is a circuit diagram illustrating an example of a voltage detection apparatus according to an embodiment of the present invention.

FIG. 1 is a circuit diagram illustrating an example of a voltage detection apparatus 20 according to an embodiment of the present invention. The voltage detection apparatus 20 is used for detecting a voltage of a battery power supply 11 used as a power source for an electric motor of a hybrid vehicle which incorporates the electric motor and a combustion engine together as a driving source thereof. In the battery power supply 11, for example, twenty four battery units 11a (three shown in FIG. 1 for simplicity), each including a prescribed number (e.g., 10) of batteries (nickel metal hydride storage batteries) in a series connection. One or more voltage detection apparatuses 20 are used for detecting the voltages of the respective battery units 11a.

An output from the battery power supply 11 is supplied to a three-phase motor 13 via an inverter 12. The rotating operation of the motor 13 provides a driving force to the vehicle.

Each of the voltage detection apparatuses 20 has a pair of capacitors 28 and 29 in a series connection, across which the voltage of the battery unit 11a can be applied via a first switch 21. Hereinafter, the capacitors 28 and 29 may be collectively referred to as "capacitor means". However, as in the embodiment described later with reference to FIG. 3, the capacitor means may include only one capacitor. The first switch 21 includes a pair of normally-open contacts 21a and 21b interlocked to each other. The normally-open contact 21a of the first switch 21 is inserted between a resistance 41 coupled to a positive electrode of the battery unit 11a and one terminal of a series circuit composed of the first capacitor 28 and the second capacitor 29. The normally-open contact 21b of the first switch 21 is inserted between a resistance 42 coupled to a negative electrode of the battery unit 11a and another terminal of the series circuit composed of the first capacitor 28 and the second capacitor 29.

A node between the first capacitor 28 and the second capacitor 29 can be body-grounded via a second switch 22. In other words, the node between the first capacitor 28 and the second capacitor 29 has a potential equal to that of the body ground when the second switch 22 is turned on. As described above, the second switch 22 functions as adjusting means for the potential of the node between the first capacitor 28 and the second capacitor 29.

A voltage across the first and second capacitors 28 and 29 in a series connection is supplied to a differential amplifier (voltage detection means) 25 via a third switch 23. The third switch 23 includes a pair of normally-open contacts 23a and 23b interlocked to each other. The normally-open contact 23a of the third switch 23 is inserted between the first capacitor 28 and a resistance 43 coupled to a negative terminal of the differential amplifier 25. The normally-open contact 23b of the third switch 23 is inserted between these condcapacitor 29a and a resistance 44 coupled to a positive terminal of the differential amplifier 25.

Input voltages to the negative terminal and the positive terminal of the differential amplifier 25 can be respectively fixed by an interlocking pair of normally-open contacts 24a and 24b of a fourth switch 24. The normally-open contact 24a of the fourth switch 24 is inserted between the negative terminal of the differential amplifier 25 and an output terminal of the differential amplifier 25. A resistance 46 is provided in parallel connection with the normally-open contact 24a. The normally-open contact 24b of the fourth switch 24 is inserted between the positive terminal of the differential amplifier 25 and the body ground. A resistance 45 is provided in parallel connection with the normally-open contact 24b.

An output from the differential amplifier 25 is supplied to an A/D converter 26. An output from the A/D converter 26 is supplied to a control device (CPU) 30 as an output from the entire voltage detection apparatus 20.

Figure 2:
FIG. 2 is a timing chart describing an operation of the voltage detection apparatus according to an embodiment of the present invention.

Now, operation of the voltage detection apparatus 20 having the above-described structure for detecting a voltage of each of the battery units 11a of the battery power supply 11 will be described based on a timing chart shown in FIG. 2. When detecting a voltage of a battery unit 11a, all of the first through fourth switches 21-24 are placed in an off-state (non-conducting state). Then, firstly, the first switch 21 is turned on (conducting) so that normally-open contacts 21a and 21b will conduct. This allows the voltage of the battery unit 11a to be applied to the first and second capacitors 28 and 29 in a series connection, thereby permitting an electric charge to be accumulated in the first and second capacitors 28 and 29.

After the first switch 21 has been kept ON for a prescribed period of time, the first switch 21 is turned OFF so that the normally-open contacts 21a and 21b will not conduct. This allows an electric charge corresponding to the voltage of the battery unit 11a to be stored in the capacitors 28 and 29 in a series connection.

After the first switch 21 is turned OFF, the second switch 22 and the fourth switch 24 are turned ON after a lapse of a prescribed period of time. In this case, it is preferable that the second switch 22 and the fourth switch 24 are turned on simultaneously, but they may be turned on at separate times. When the second switch 22 is turned on, the node between the first capacitor 28 and the second capacitor 29 is body-grounded and a potential of the node between the capacitors 28 and 29 is fixed to the body ground potential (preferably 0 V). In this case, a potential at one end of the capacitor 29 may be equal to or less than that of the body ground. Moreover, when the fourth switch 24 is turned on so that each of the normally-open contacts 24a and 24b will conduct, the potential of the negative terminal of the differential amplifier 25 is fixed to a potential equal to that of the output node of the differential amplifier 25 (0 V), and the potential of the positive terminal thereof is fixed to the body ground potential (0 V). The potential of the node between the capacitors 28 and 29, which is equal to the potential of the positive terminal of the differential amplifier 25 at this point, serves as a reference potential of the differential amplifier 25.

After a lapse of a prescribed period of time since the second switch 22 and the fourth switch 24 are turned on, the third switch 23 is turned on so that the normally-open contacts 23a and 23b will conduct. This allows the first and second capacitors 28 and 29 to be respectively coupled to the negative terminal and the positive terminal of the differential amplifier 25. Since the fourth switch 24 is in an on-state, the voltage of each terminal of the differential amplifier 25 is fixed. Therefore, the voltage across the first and second capacitors 28 and 29 is not applied to the respective terminals of the differential amplifier 25.

After a lapse of a prescribed period of time since the third switch 23 is turned on, the fourth switch 24 is turned off. As a result, the voltage of each terminal of the differential amplifier 25 is no longer fixed, so that a voltage corresponding to the electric charge stored in the first and second capacitors 28 and 29 is applied to the differential amplifier 25.

In this case, the voltage of each of the capacitors 28 and 29 is applied to each input terminal of the differential amplifier 25, while the voltage of each input terminal of the differential amplifier 25 is fixed to 0 V. Therefore, it is ensured that the voltage of each input terminal will be kept within a tolerable range. Accordingly, an output from the differential amplifier 25 is prevented from being saturated, and the voltage applied from each of the capacitors 28 and 29 can be accurately detected. Moreover, since the voltage input to the differential amplifier 25 will be kept within a tolerable range, deterioration and breakdown of the differential amplifier 25 can be prevented.

As described above, after an electric charge corresponding to the voltage of the battery unit 11a is accumulated in the first capacitor 28 and the second capacitor 29, a stabilized voltage across the first capacitor 28 and the second capacitor 29 is applied to the differential amplifier 25, so that the differential amplifier 25 can stably detect the voltage across the capacitors 28 and 29.

The differential amplifier 25 outputs to the A/D converter 26 a signal corresponding to the voltage applied from the capacitors 28 and 29. The A/D converter 26 converts the output from the differential amplifier 25 to a digital signal and outputs the resultant signal to the control device 30. The control device 30 determines whether the voltage of the battery unit 11a as detected by the voltage detection apparatus 20 has a normal value based on the digital signal output from the A/D converter 26.

As described above, the voltage of each battery unit 11a is separately detected by the respective voltage detection apparatus 20, whereby it can be determined whether the voltage of each battery unit 11a is normal.

Figure 3:
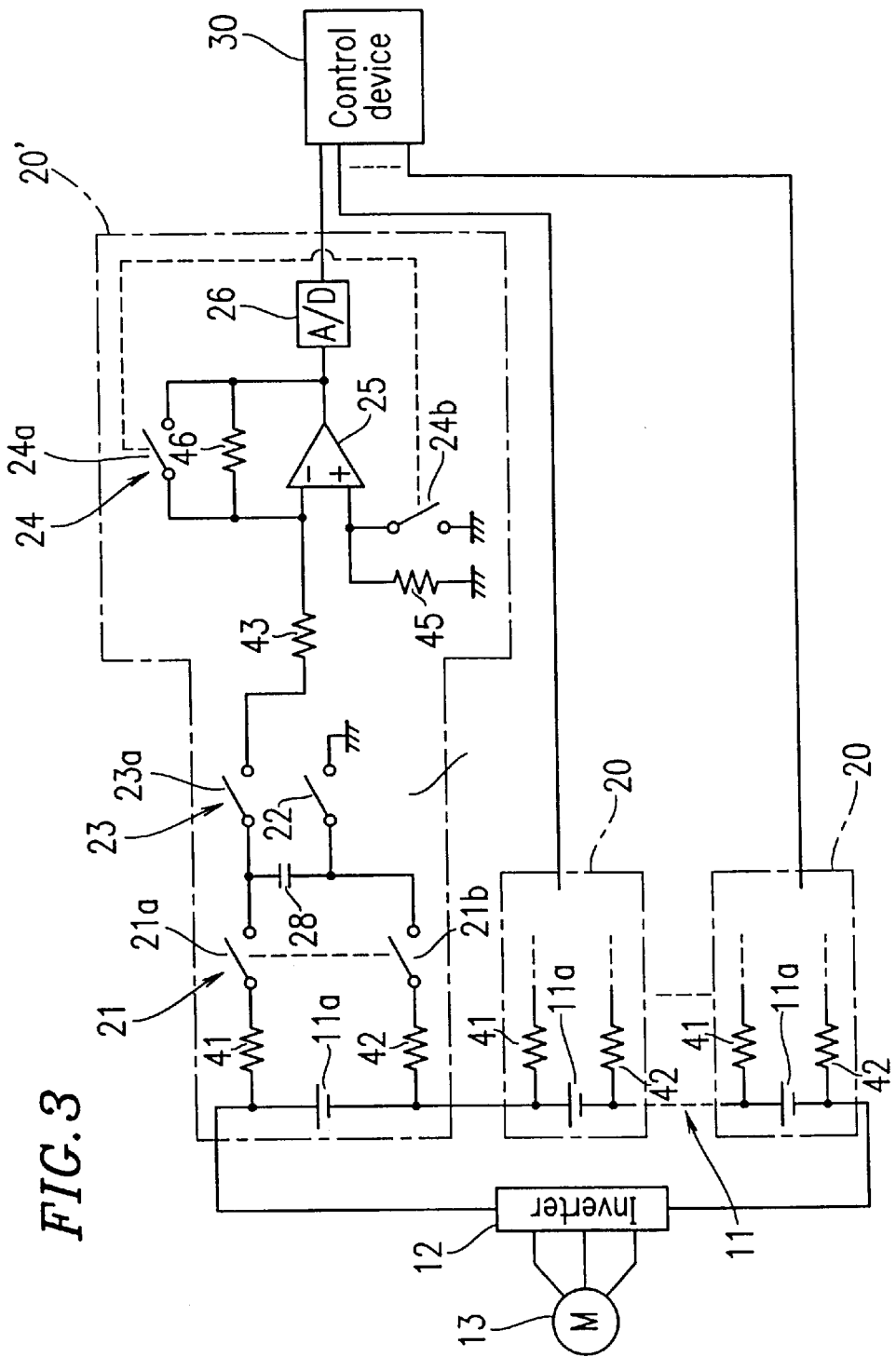
FIG. 3 is a circuit diagram illustrating an example of a voltage detection apparatus according to another embodiment of the present invention.

FIG. 3 illustrates a voltage detection apparatus 20' according to an embodiment of the present invention. The structure of the voltage detection apparatus 20' is the same as that of the voltage detection apparatus 20 (FIG. 1) except that the capacitor 29, the normally-open contact 23b and the resistance 44 are omitted. Operating procedures are essentially the same as those of the voltage detection apparatus 20. Only one capacitor 28 is provided in the voltage detection apparatus 20' as a capacitor to which a voltage of the battery unit 11a is applied, whereby the structure of the voltage detection apparatus 20' can be simplified.

In each of the above-described embodiments of the invention, as each of the first through third switches 21–23 (but not the fourth switch 24 used for stabilizing the voltage of each input terminal of the differential amplifier 25), a transistor such as an FET (field-effect transistor) or an SSR (solid-state relay) incorporating such a transistor so as to have a high voltage breakdown value, e.g.,. 400 V, may be used. The differential amplifier 25 used herein may be of any type commonly used in the art.

Moreover, the voltage detection apparatus may be structured so that the on/off timing of each of the switches 21–24 is controlled by the control device 30 or another control device.

The above-described embodiments have a structure in which the voltage detection apparatus 20 or 20' is provided corresponding to each battery unit 11a, but the present invention is not limited to such a structure. For example, only one voltage detection apparatus 20 or 20' may be used so as to be selectively coupled to each of the battery units 11a in turn.

Moreover, three or more capacitors may be provided for accumulating therein an electric charge corresponding to a voltage of a battery unit 11a. In this case, at least one preselected capacitor may be body-grounded via the second switch 22 while the other capacitors may be electrically coupled to the second switch 22 via the preselected capacitor.

Moreover, the present invention is operable even if the fourth switch 24 is omitted from the voltage detection apparatus 20 or 20'. However, it is more preferable that the voltage detection apparatus 20 or 20' includes the fourth switch 24.

Moreover, the A/D converter 26 may be provided externally to the voltage detection apparatus 20 or 20'.

The present invention provides an apparatus and a method for detecting a voltage which is capable of accurately measuring a voltage of a battery, where a differential amplifier is used to detect a voltage across a capacitor(s) to which a voltage of the battery is applied, the voltage across the capacitor(s) being stabilized in the manner described above. Moreover, a voltage of each input terminal of the differential amplifier is fixed to a prescribed voltage value so that the voltage applied by each capacitor to the differential amplifier is stabilized. Therefore, the voltage of a battery can be detected more accurately.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A voltage detection apparatus for detecting a voltage of at least one battery, said voltage detection apparatus comprising:

capacitor means to which a voltage is applied from the at least one battery and in which an electric charge accumulates;

adjustment means for adjusting potentials at a first end and a second end of the capacitor means such that a potential difference between a potential at said first end of the capacitor means and a reference potential is less than a potential difference between a potential at a first end of the at least one battery and the reference potential, and that a potential difference between a potential at said second end of the capacitor means and the reference potential is less than a potential difference between a potential at said second end of the at least one battery and the reference potential; and voltage detection means for detecting a voltage of the at least one battery based on a potential difference between said first end of the capacitor means and said second end of the capacitor means after the potentials of said first and second ends of the capacitor means have been adjusted by the adjustment means, said voltage detection means being connected to a resistance means, said resistance means coupled to said adjustment means.

2. A voltage detection apparatus according to claim 1, wherein the capacitor means comprises a plurality of capacitors in a series connection.

3. A voltage apparatus for detecting a voltage of at least one battery, said voltage detection apparatus comprising:

capacitor means to which a voltage is applied from the at least one battery and in which an electric charge accumulates;

adjustment means for adjusting potentials at a first end and a second end of the capacitor means such that a potential difference between a potential at said first end of the capacitor means and a reference potential is less than a potential difference between a potential at a first end of the at least one battery and the reference potential, and that a potential difference between a potential at said second end of the capacitor means and the reference potential is less than a potential difference between a potential at said second end of the at least one battery and the reference potential; and voltage detection means for detecting a voltage of the at least one battery based on a potential difference between said first end of the capacitor means and said second end of the capacitor means after the potentials of said first and second ends of the capacitor means have been adjusted by the adjustment means;

wherein the capacitor means is electrically connected with the at least one battery via a first switching means; the adjustment means comprises a second switching means for switching a state of the capacitor means so as to be electrically coupled or decoupled to or from a prescribed potential; and the voltage detection means is electrically coupled to the capacitor means via a third switching means.

4. A voltage detection apparatus according to claim 3, wherein the capacitor means is electrically coupled to the prescribed potential via the second switching means and the potentials at both ends of the capacitor means are adjusted.

5. A voltage detection apparatus for detecting a voltage of at least one battery, said voltage detection apparatus comprising capacitor means to which a voltage is applied from the at least one battery and in which an electric charge accumulates;

adjustment means for adjusting potentials at a first end and a second end of the capacitor means such that a potential difference between a potential at said first end of the capacitor means and a reference potential is less than a potential difference between a potentials at a first end of the at least one battery and the reference potential, ant that a potential difference between a potential at said second end of the capacitor means and the reference potential is less than a potential difference between a potential at said second end of the at least one battery and the reference potential; and voltage detection means for detecting a voltage of the at least one battery based on a potential difference between said first end of the capacitor means and said second end of the capacitor means after the potentials of said and second ends of the capacitor means have been adjusted by the adjustment means;

wherein a potential difference between said first end of the a least one battery and said second end of the at least one battery is equal to the potential difference between said first end of the capacitor means and said second end of the capacitor means.

6. A voltage detection apparatus according to claim 3, wherein the capacitor means comprises a plurality of capacitors in a series connection and at least one node between the plurality of capacitors is coupled to the prescribed potential via the second switching means.

7. A voltage detection apparatus according to claim 3, further comprising a fourth switching means for switching a state of a first input terminal of the voltage detection means so as to be electrically coupled or decoupled to or from the reference potential.

8. A voltage detection apparatus according to claim 7, wherein the first input terminal is electrically coupled to the reference potential via the fourth switching means and a potential of the first input terminal is equal to the reference potential.

9. A voltage detection apparatus for detecting a voltage of at least one battery, said voltage detection apparatus comprising:

capacitor means to which a voltage is applied from the at least one battery and in which an electric charge accumulates;

adjustment means for adjusting potentials at a first end and a second end of the capacitor means such that a potential difference between a potential at said first end of the capacitor means and reference potential is less than a potential difference between a potential at a first end of the at least one battery and the reference potential, and that a potential difference between a potential at said second end of the capacitor means and the reference potentials less than a potential difference between a potential at said second end of the at least one battery and the reference potential;

voltage detection means for detecting a voltage of the at least one battery based on a potential difference between said first end of the capacitor means and said end of the capacitor means after the potentials of said first and second ends of the capacitor means have been adjusted by the adjustment means; and conversion means for converting an analog signal from the voltage detection means to a digital signal.

10. A voltage detection apparatus for detection a voltage of at least one battery, said voltage detection apparatus comprising:

capacitor means to which a voltage is applied from the at least one battery and in which an electric charge accumulates;

adjustment means for adjusting potentials at a first end and a second end of the capacitor means such that a potential difference between a potential at said first end of the capacitor means and reference potential is less than a potential difference between a potential at a first end of the at least one battery and the reference potential, and that a potential difference between a potential at said second end of the capacitor means and the reference potential is less than a potential difference between a potential at said second end of the at least one battery and the reference potential; and voltage detection means for detecting a voltage of the at least one battery based on a potential difference between said first end of the capacitor means and said second end of the capacitor means after the potentials of said first and second ends of the capacitor means have been adjusted by the adjustment means, wherein the voltage detection means is a differential amplifier.

11. A method for detecting a voltage of at least one battery by means of the voltage detection apparatus according to claim 3, comprising the steps of:

electrically coupling the at least one battery to the capacitor means via the first switching means so as to allow an electric charge to accumulate in the capacitor means;

electrically isolating the at least one battery and the capacitor means from each other after the electric charge is accumulated in the capacitor means;

electrically coupling the capacitor means to the reference potential via the second switching means, thereby adjusting the potentials at said first end and said second end of the capacitor means;

electrically coupling the capacitor means to the voltage detection means via the third switching means; and detecting the potential difference between said first end of the capacitor means and said second end of the capacitor means using the voltage detection means.

12. A method according to claim 11, wherein the voltage detection apparatus includes a fourth switching means for switching a state of a first input terminal of the voltage detection means so as to be electrically coupled or decoupled to or from the reference potential, the method further comprising the steps of:

electrically coupling the first input terminal to the reference potential via the fourth switching means; and switching a state of the first input terminal so as not to be electrically coupled to the reference potential via the fourth switching means after the step of electrically coupling the capacitor means to the voltage detection means.

13. A method according to claim 12, wherein the step of adjusting the potentials at said first and second ends of the capacitor means and the step of electrically coupling the first input terminal to the reference potential are performed simultaneously.

* * * * *